(12) United States Patent
Miyabayashi et al.

(10) Patent No.: US 11,765,844 B2
(45) Date of Patent: Sep. 19, 2023

(54) ELECTRONIC DEVICE

(71) Applicant: DENSO CORPORATION, Kariya (JP)

(72) Inventors: Hideki Miyabayashi, Kariya (JP); Kenji Ochi, Kariya (JP); Kazuma Kawai, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/733,312

(22) Filed: Apr. 29, 2022

(65) Prior Publication Data

US 2022/0264753 A1 Aug. 18, 2022

Related U.S. Application Data

(63) Continuation of application No. PCT/JP2020/039557, filed on Oct. 21, 2020.

(30) Foreign Application Priority Data

Oct. 30, 2019 (JP) ................ 2019-197161

(51) Int. Cl.
*H05K 5/00* (2006.01)
*H05K 9/00* (2006.01)
*H02M 3/00* (2006.01)

(52) U.S. Cl.
CPC ......... *H05K 5/0069* (2013.01); *H05K 9/0024* (2013.01); *H02M 3/003* (2021.05)

(58) Field of Classification Search
CPC .... H05K 5/0069; H05K 9/0024; H02M 3/003

USPC ........................................... 361/752
See application file for complete search history.

(56) References Cited

U.S. PATENT DOCUMENTS

| | | | |
|---|---|---|---|
| 6,906,483 B2 * | 6/2005 | Tominaga | B62D 5/0406 361/752 |
| 2012/0161900 A1 | 6/2012 | Sakoda et al. | |
| 2020/0103691 A1 * | 4/2020 | Ohashi | G02F 1/13452 |

FOREIGN PATENT DOCUMENTS

JP 2724506 B2 3/1998

* cited by examiner

*Primary Examiner* — Andargie M Aychillhum
(74) *Attorney, Agent, or Firm* — Oliff PLC

(57) ABSTRACT

A power conversion device, as an electronic device, includes a circuit substrate, a metal housing, an external connection terminal, and an insulator. The external connection terminal projects from the interior to the exterior of the metal housing, and is used to connect an output terminal of the circuit substrate to the exterior. A part of the insulator is disposed between the metal housing and the external connection terminal, and insulates the metal housing and the external connection terminal from one another. A housing extension portion is formed in the metal housing, extending from a body portion of the metal housing, in the inward direction with respect to the metal housing, in a condition facing the external connection terminal. A part of the insulator is disposed between the external connection terminal and the housing extension portion.

8 Claims, 13 Drawing Sheets

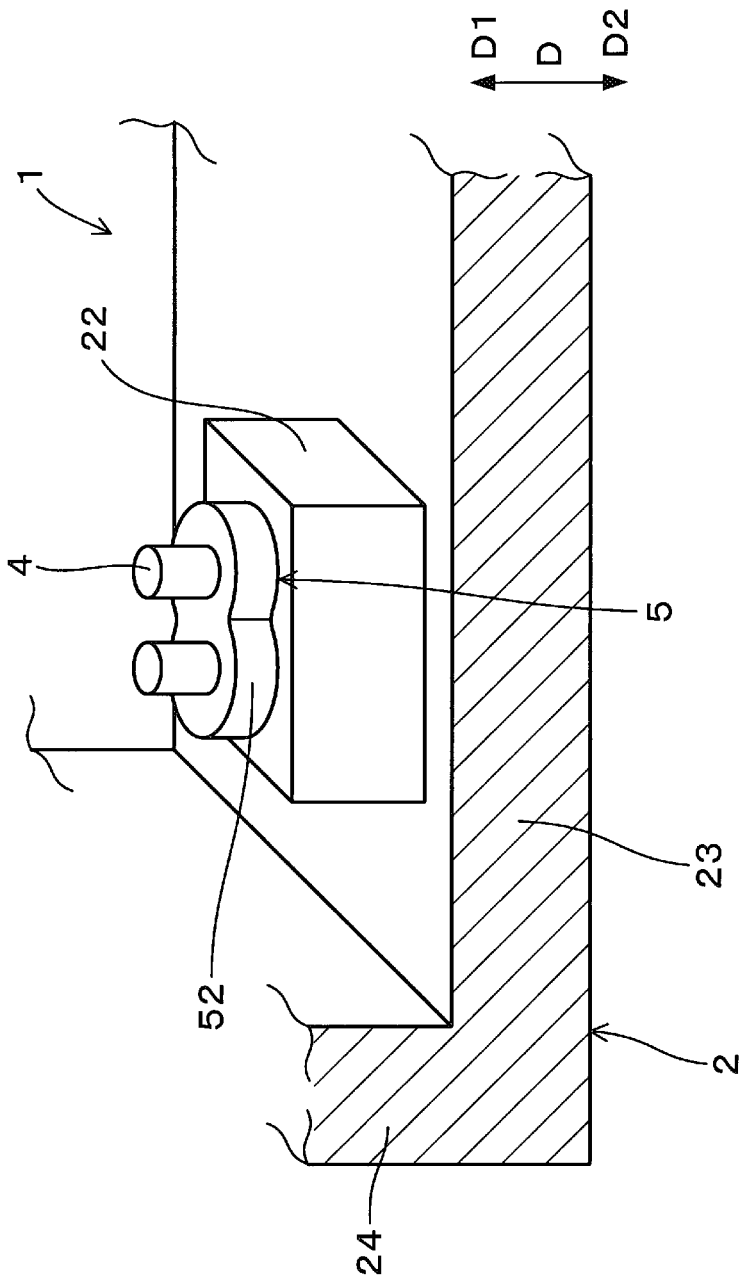

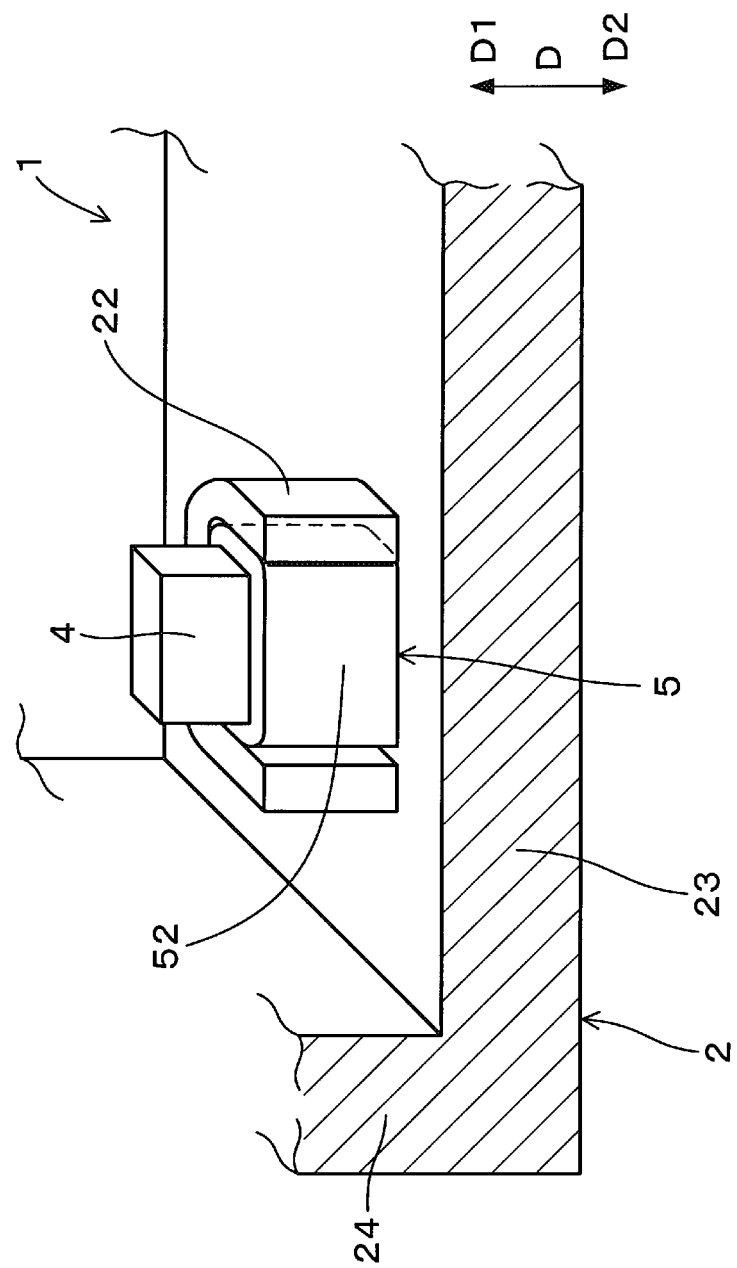

ELECTRONIC DEVICE

CROSS-REFERENCE TO RELATED APPLICATION

The present application is a continuation application of International Application No. PCT/JP2020/039557, filed on Oct. 21, 2020, which claims priority to Japanese Patent Application No. 2019-197161, filed on Oct. 30, 2019. The contents of these applications are incorporated herein by reference in their entirety.

BACKGROUND

1. Technical Field

The present disclosure relates to an electronic device.

2. Related Art

A power conversion device is an electronic device used for applications such as conversion of the magnitude of DC power, conversion of DC to AC power, conversion of AC to DC power, and conversion of AC frequency.

SUMMARY

The present disclosure provides an electronic device. As an aspect of the present disclosure, an electronic device includes at least a circuit substrate, a metal housing, an external connection terminal, and an insulator. An electric circuit is formed on the circuit substrate. The metal housing houses the circuit substrate, is grounded to a first ground, and is connected to a second ground of the circuit substrate. The external connection terminal projects from the interior to the exterior of the metal housing, and connects an input terminal or an output terminal of the circuit substrate to the exterior. The insulator has at least a part thereof disposed between the metal housing and the external connection terminal and insulates the metal housing and the external connection terminal from one another. The metal housing is formed with a housing extension portion that extends inward or outward with respect to a body portion of the metal housing while facing the external connection terminal, and at least a part of the insulator is disposed between the external connection terminal and the housing extension portion.

BRIEF DESCRIPTION OF THE DRAWINGS

The above and other objectives, features and advantages of the present disclosure will be made clearer by the following detailed description, given with reference to the accompanying drawings. In the drawings:

FIG. 12 is a perspective cross-sectional view showing the periphery of an external connection terminal and a housing extension portion of a power conversion device according to a third embodiment; and FIG. 13 is a perspective cross-sectional view showing the periphery of the external connection terminal and the housing extension portion of another power conversion device according to the third embodiment.

DETAILED DESCRIPTION OF THE PREFERRED EMBODIMENTS

Figure 1:
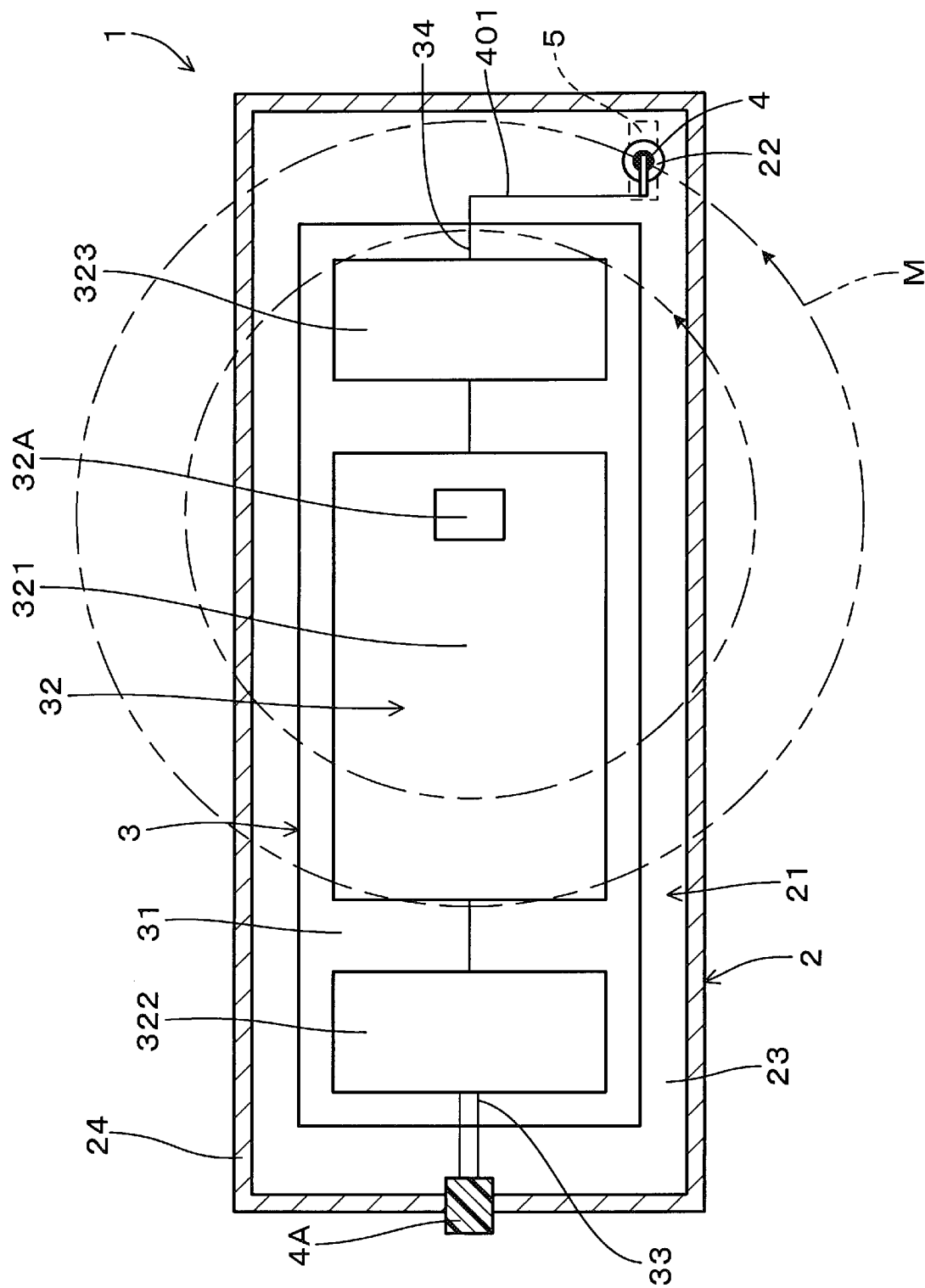
FIG. 1 is a plan view schematically showing the interior of a power conversion device according to a first embodiment.

The power conversion device has a switching element used for power conversion. Noise is generated in the power conversion device when the switching element operates. Measures have therefore been taken to prevent this noise from affecting equipment that is outside the power conversion device.

For example, with the electronic device of JP 2012-135175 A (Japanese Unexamined Patent Publication No. 2012-135175), in which a housing serves as shield material, means are devised for preventing noise generated inside the housing from being propagated to an external device that is connected to an output line. Specifically, in that electronic device, a filter capacitor is provided on an output terminal block that is attached to the exterior of the housing, and the filter capacitor is connected to the output line.

It has been found that there are the following points of improvement when a capacitor is used an electronic component for suppressing the propagation of noise, such as the filter capacitor in the electronic device of JP 2012-135175 A or the like. When a capacitor is used as an electronic component, it is found that the noise propagation suppression effect is liable to be adversely influenced by the equivalent series inductance (parasitic inductance) and equivalent series resistance of the capacitor, and by the impedance of the wiring which connects the capacitor to the output line. In particular, with a capacitor as an electronic component, the noise propagation suppression effect can be observed for noise having a frequency of several MHz or less, however the effect is not observed to any significant degree in the case of noise having a frequency of several tens of MHz or more, or several hundred MHz or more.

One or more aspects of the present disclosure are directed to provide an electronic device capable of enhancing the noise propagation suppression effect.

According to an aspect of the present disclosure, an electronic device includes at least a circuit substrate, a metal housing, an external connection terminal, and an insulator. An electric circuit is formed on the circuit substrate. The metal housing houses the circuit substrate, is grounded to a first ground, and is connected to a second ground of the circuit substrate. The external connection terminal projects from the interior to the exterior of the metal housing, and connects an input terminal or an output terminal of the circuit substrate to the exterior. The insulator has at least a part thereof disposed between the metal housing and the external connection terminal and insulates the metal housing and the external connection terminal from one another. The metal housing is formed with a housing extension portion that extends inward or outward with respect to a body portion of the metal housing while facing the external connection terminal, and at least a part of the insulator is disposed between the external connection terminal and the housing extension portion.

In the electronic device, a housing extension portion is formed in the metal housing, and at least a part of the insulator is disposed between the external connection terminal and the housing extension portion. A pseudo capacitor is thereby formed, which reduces the propagation of noise from an external device to the electronic device via the external connection terminal, or the propagation of noise from the electronic device to an external device via the external connection terminal.

The noise reduction structure using this pseudo capacitor is implemented without using a capacitor as an electronic component, and can eliminate the equivalent series inductance and the equivalent series resistance that are characteristic of a capacitor. Furthermore, the wiring that is required for connecting a capacitor can be eliminated. As a result, it is possible to obtain effective reduction of noise propagation even in the case of high frequency noise, for which effective reduction of noise propagation could not be achieved by using a capacitor as an electronic component.

While it is possible to eliminate a capacitor for reducing noise propagation with the electronic device, it is also possible to use a capacitor, as an electronic component for reducing noise propagation in combination with the pseudo capacitor. In that case, the combined use of the pseudo capacitor and the capacitor as an electronic component may provide more effective reduction of noise.

Hence, the electronic device of the present disclosure enables more effective reduction of noise propagation to be achieved.

Preferred embodiments of the above-mentioned electronic device are described in the following with reference to the drawings.

First Embodiment

Figure 2:
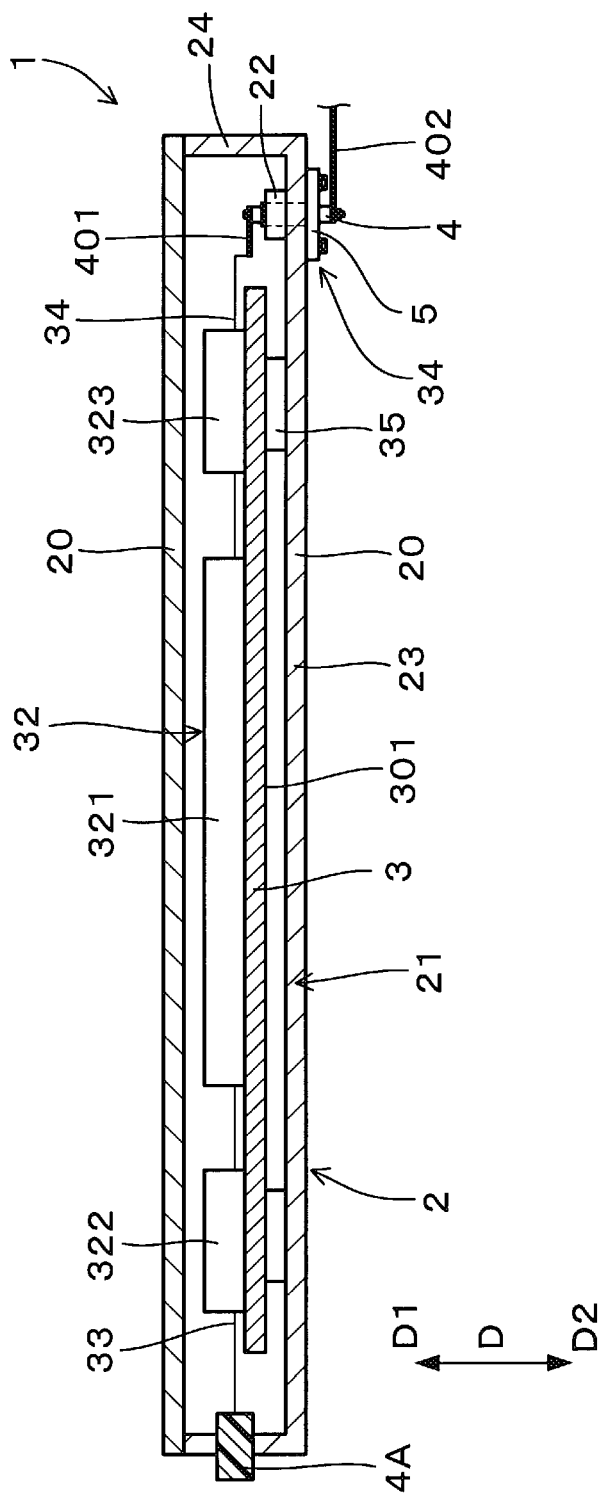
FIG. 2 is a frontal view schematically showing the interior of the power conversion device according to the first embodiment.
Figure 3:
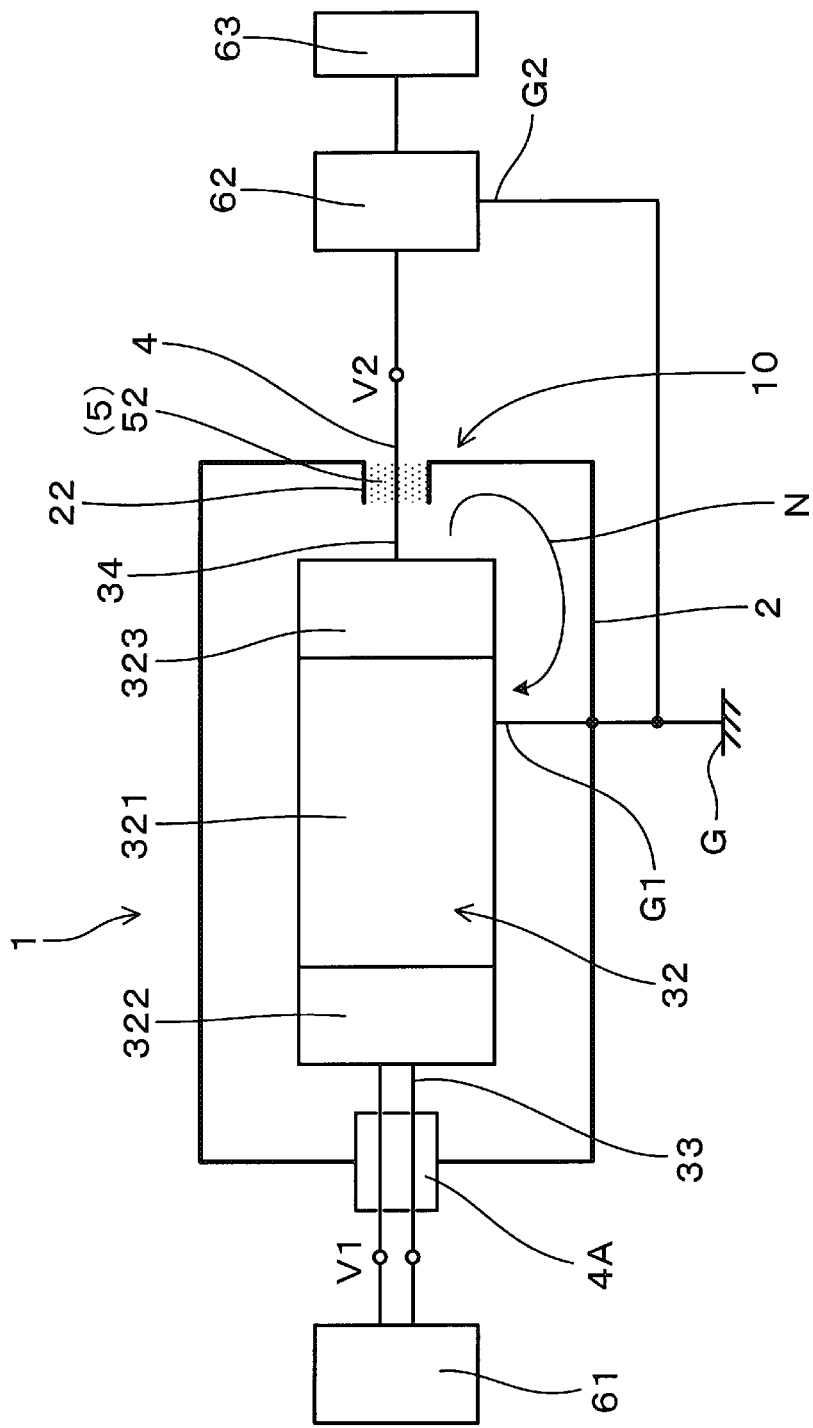
FIG. 3 is a schematic electrical configuration diagram of the formation of a pseudo capacitor in the power conversion device according to the first embodiment.

As shown in FIGS. 1 to 3, an electronic device of the present embodiment is a power conversion device 1 that converts the magnitude of DC power, in other words, a DC-DC converter. The power conversion device 1 includes a circuit substrate 3, a metal housing 2, an external connection terminal 4, and an insulator 5. The circuit substrate 3 has an electric circuit in which a switching element 32A is used. The metal housing 2 houses the circuit substrate 3 and is grounded to a ground G. A ground G1 of the circuit substrate 3 is connected to the metal housing 2.

Figure 4:
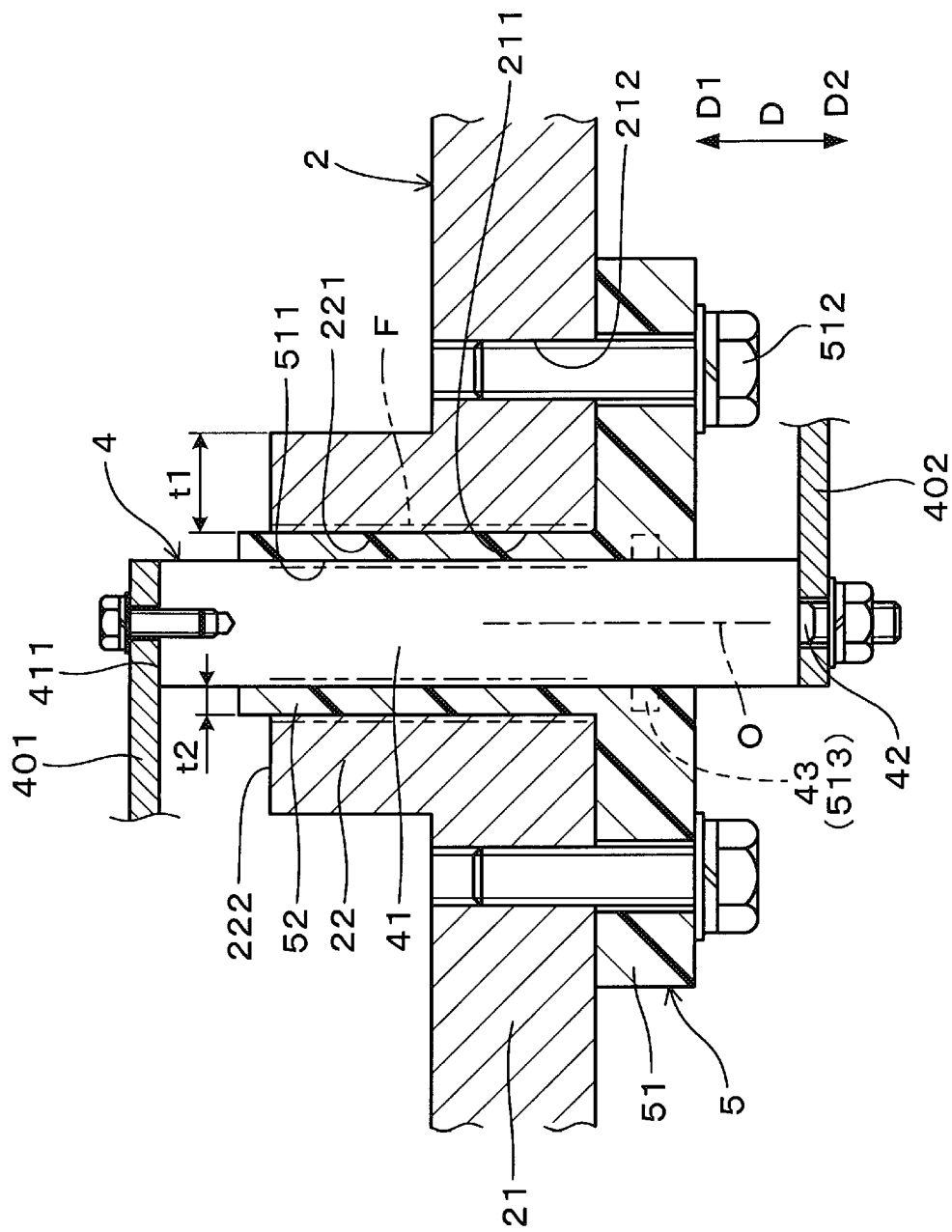
FIG. 4 is a cross-sectional view showing the periphery of an external connection terminal and a housing extension portion of the power conversion device according to the first embodiment.
Figure 5:
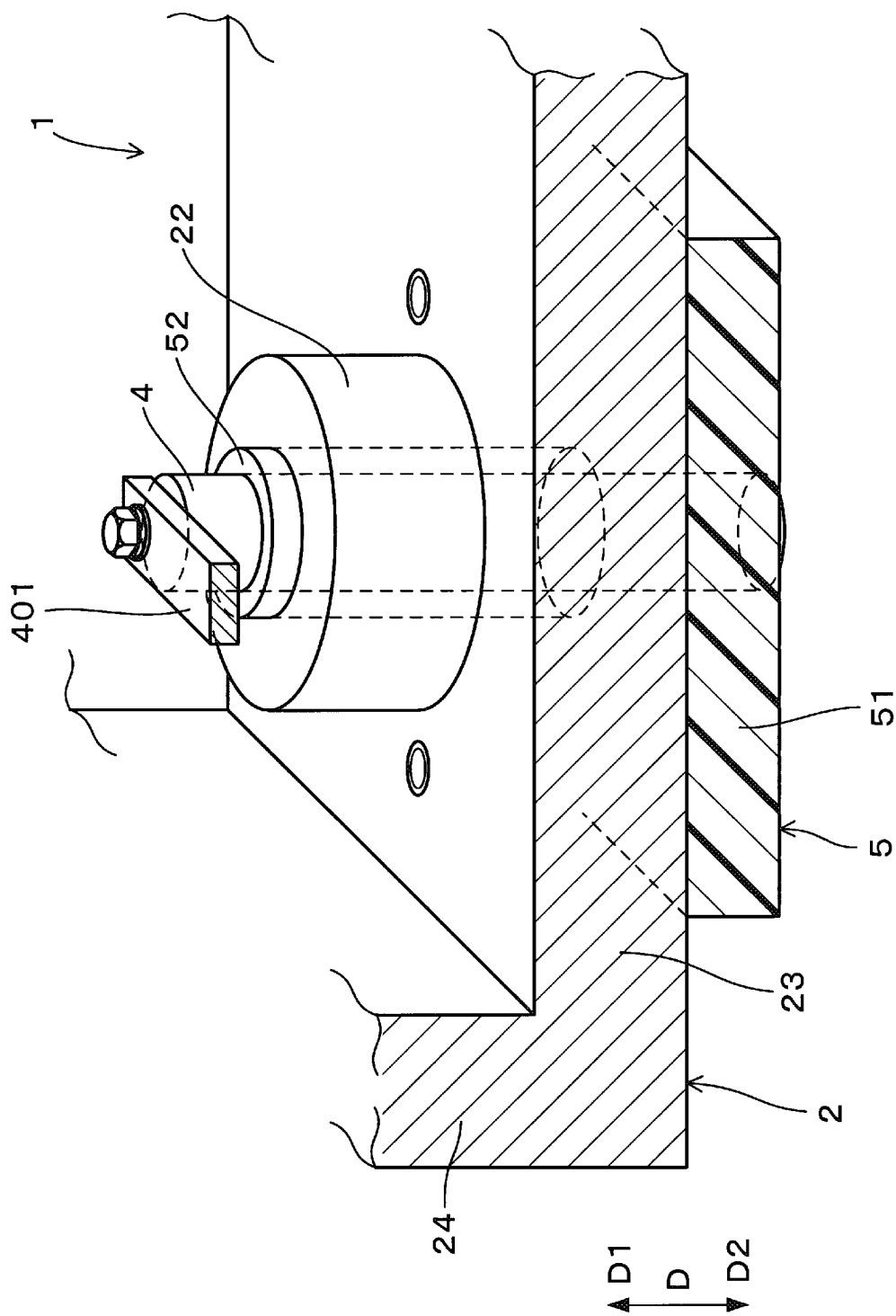
FIG. 5 is a perspective cross-sectional view showing the periphery of the external connection terminal and the housing extension portion of the power conversion device according to the first embodiment.

As shown in FIGS. 4 and 5, the external connection terminal 4 projects from the interior of the metal housing 2 to the exterior, and is used to connect an output terminal 34 of the circuit substrate 3 to the exterior. A part of the insulator 5 is disposed between the metal housing 2 and the external connection terminal 4, and insulates the metal housing 2 and the external connection terminal 4 from one another. The metal housing 2 is formed with a housing extension portion 22 extending from a body portion 21 of the metal housing 2 in the inward direction D1 of the metal housing 2 while facing the external connection terminal 4. A part of the insulator 5 is disposed between the external connection terminal 4 and the housing extension portion 22.

The power conversion device 1 of the present embodiment is described in detail in the following.

(Power Converter 1)

As shown in FIG. 3, the power conversion device 1 of the present embodiment serves to convert the DC voltage V1 of a battery 61, that is mounted on a vehicle, to the DC voltage V2 used for a battery 62 mounted on the vehicle and for a low power device 63, etc., by means of the electric circuit on the circuit substrate 3. The battery 61 has a voltage of several hundred volts, such as is used with a motor for driving a hybrid vehicle, an electric vehicle, or the like. The battery 62 has a voltage in the range of several volts to several tens of volts, while the low power device 63, etc., uses a voltage in the range of several volts to several tens of volts. The battery 62 and the low power device 63, etc., are connected to the output terminal 34 of the circuit substrate 3 of the power conversion device 1 as external devices.

The power conversion device 1 has a structure which blocks the propagation of noise N, generated by the operation of the switching element 32A or the like on the circuit substrate 3, to the battery 62, the low power device 63, etc., that are connected to the external connection terminal 4 as external devices. Specifically, in the power conversion device 1, a pseudo capacitor 10 is formed by the insulator 5 and the housing extension portion 22, and the pseudo capacitor reduces the propagation of noise N via the external connection terminal 4 from the interior of the metal housing 2 to the exterior.

As shown in FIG. 4, the pseudo capacitor 10 is configured by using the external connection terminal 4 and the metal housing 2 as a pair of electrodes and using a part of the insulator 5 as a dielectric. In FIG. 4, the parts of the external connection terminal 4 and the metal housing 2 used as the pair of electrodes are indicated by alternate long and short dash lines F.

The capacitance C [F] of the pseudo capacitor 10 is expressed as $C = \varepsilon \cdot S/d$, where $\varepsilon$ [F/m] indicates the dielectric constant of the insulator 5, S [m$^2$] indicates the facing area of the pair of electrodes formed by the portions of the external connection terminal 4 and the metal housing 2 facing each other, and d [m] indicates the thickness t2 of the insulator 5 configuring the dielectric disposed between the external connection terminal 4 and the metal housing 2. The facing area of the pair of electrodes constituted by the external connection terminal 4 and the metal housing 2 is the sum of the facing area between the outer circumference of the external connection terminal 4 and a through hole 211 of the body portion 21 and the facing area between the outer circumference of the external connection terminal 4 and the center hole 221 of the housing extension portion 22.

In the present embodiment, in order to increase the capacitance C of the pseudo capacitor 10 as much as possible, the area where the external connection terminal 4 and the metal housing 2 face each other is increased, while the thickness t2 of the insulator 5 is made small. However, the magnitude of the facing area of the external connection terminal 4 and the metal housing 2 is restricted to the extent that the circumference of the external connection terminal 4 does not become excessively large. Furthermore, the thickness t2 of the insulator 5 is reduced only to the extent that the insulating properties can be ensured.

As indicated in FIGS. 1 and 3, large changes in magnetic field are produced by large changes in voltage (or current) that occur in parts of the wiring when energization and interruption of energization are performed by switching operation of the switching element 32A. These changes in the magnetic field are produced as noise N. The noise N, superimposed on the external connection terminal 4 from the output terminal 34 of the circuit substrate 3, returns to the circuit substrate 3 via the pseudo capacitor 10, the metal housing 2, and the ground G1 of the circuit substrate 3. As a result, the noise N superimposed on the external connection terminal 4 is reduced, and is prevented from propagating from the interior to the exterior of the metal housing 2 via the external connection terminal 4.

FIG. 3 is a schematic electrical configuration diagram showing the pseudo capacitor 10 formed in the power conversion device 1. The circuit substrate 3 is housed inside the metal housing 2. The external connection terminal 4 is connected to the insulator 3 via an internal wiring 401. An input-side external connection terminal 4A is connected via wiring to an input terminal 33 of the circuit substrate 3, and an output-side external connection terminal 4 is connected via the internal wiring 401 to an output terminal 34 of the circuit substrate 3. The metal housing 2 is formed with a through hole through which the input-side external connection terminal 4A is inserted and a through hole 211 through which the output-side external connection terminal 4 is inserted. The input-side external connection terminal 4A is insulated from the metal housing 2 via an insulating material.

(Input-Side External Connection Terminal 4A)

The pseudo capacitor 10 of the present embodiment is formed by using the output-side external connection terminal 4 and the insulator 5. However, the pseudo capacitor 10 may also be formed by using the input-side external connection terminal 4A, an input-side housing extension portion extending from the metal housing 2 around the external connection terminal 4A, and an insulating material. In that case, the pseudo capacitor 10 can reduce the propagation of noise N from the exterior to the interior of the power conversion device 1 via the input-side external connection terminal 4A. Furthermore. pseudo capacitors 10 may be formed both at the position where the input-side external connection terminal 4A and the input-side housing extension portion are formed and also at the position where the output-side external connection terminal 4 and the housing extension portion 22 are formed.

(Ground G)

As shown in FIG. 3, the ground G1 of the circuit substrate 3 and a ground G2 of the battery 62, the low power device 63, etc., as external devices, are connected to the ground G that is common to the metal housing 2. The ground G1 of the circuit substrate 3 is connected via wiring to the metal housing 2. The ground G1 of the circuit substrate 3 is connected to the ground G via a mounting portion 35, provided for mounting the circuit substrate 3 on the metal housing 2 as shown in FIG. 2. Furthermore, it is equally possible to connect the ground G1 of the circuit substrate 3 to the ground G via wiring that is connected from the circuit substrate 3 to the metal housing 2.

The ground G1 of the circuit substrate 3 is disposed as close as possible to the housing extension portion 22 forming the pseudo capacitor 10. With this configuration, the noise N can be quickly returned to the circuit substrate 3 via the metal housing 2 from the external connection terminal 4 and the pseudo capacitor 10.

(Metal Housing 2)

The metal housing 2, shown in FIGS. 1 and 2, has conductivity, being made of an aluminum material such as aluminum or an aluminum alloy. The metal housing 2 is used to house and protect the circuit substrate 3, etc., in its interior. The metal housing 2 is configured by two housing parts 20 which are separable. The two housing parts 20 accommodate the circuit substrate 3 inside, and are joined with screws, etc., sealing the gap between them.

As shown in FIGS. 2 and 5, the body portion 21 of the metal housing 2 has a bottom 23 facing a plate surface 301 of the circuit substrate 3 and a side wall portion 24 which rises from the bottom 23, at the outer edge thereof. The term "body portion 21" of the metal housing 2 refers to the parts of the metal housing 2 other than the housing extension portion 22. The term "plate surface 301" of the circuit substrate 3 refers to the surface of the circuit substrate 3 having the largest area. The bottom 23 of the metal housing 2 forms the surface of the metal housing 2 having the largest area. It is equally possible to form a pedestal portion in the metal housing 2, with the external connection terminal 4 disposed on the pedestal portion, parallel to the bottom 23.

The metal housing 2 has the through hole 211 formed therein, for inserting the external connection terminal 4. The through hole 211 of the present embodiment is formed in the bottom 23 of the metal housing 2. It is equally possible for the through hole 211 to be formed in the pedestal portion of the metal housing 2. The body portion 21 of the metal housing 2 is grounded to the ground (earth) G, whose potential is 0V.

(Housing Extension Portion 22)

As shown in FIGS. 4 and 5, the housing extension portion 22 is formed facing the external connection terminal 4 within a range of half a circumference or more around the external connection terminal 4, at the peripheral edge of the through hole 211 in the metal housing 2. The term "periphery of the external connection terminal 4" signifies the outer peripheral side of the external connection terminal 4 with respect to the central axis O. The housing extension portion 22 of the present embodiment is formed around the entire circumference of the external connection terminal 4. This configuration enables a suitable capacitance C to be obtained for the pseudo capacitor 10. The housing extension portion 22 of the present embodiment is formed in a tubular shape, having a center hole 221 that communicates with the through hole 211 of the metal housing 2. The center hole 221 is formed to be continuous with the through hole 211. The through hole 211 and the center hole 221 of the housing extension portion 22 are formed as circular holes.

As shown in FIG. 2, the housing extension portion 22 of the present embodiment is formed in a state orthogonal to the bottom 23 of the metal housing 2, which faces the plate surface 301 of the circuit substrate 3. The central axis O passing through the center of the external connection terminal 4 is orthogonal to the bottom 23 of the metal housing 2. In other words, the housing extension portion 22 is formed in a state orthogonal to the bottom 23, which has the largest area in the metal housing 2, and parallel to the side wall portion 24. Hence, when a housing part 20 of the metal housing 2 is molded by a method such as die casting, the housing extension portion 22 can be formed extending along the direction in which the housing part 20 is released from the molding die. The shape of the housing extension portion 22 can thus be easily added to the housing part 20.

As shown in FIG. 1, the housing extension portion 22, formed from the body portion 21 of the metal housing 2 and extending in the direction D1 of the metal housing 2, is in state where it is intersected by the magnetic flux M generated by the switching operation of the switching element 32A provided on the circuit substrate 3. With this configuration, the radiated noise generated inside the metal housing 2 can be shielded by the housing extension portion 22, and thus the radiated noise is made less likely to affect the external connection terminal 4. Hence, it can be made more difficult for noise to propagate from the external connection terminal 4 to the exterior of the metal housing 2.

More specifically, during the switching operation of the switching element 32A, a magnetic field is generated around a lead portion that is a conductor for the switching element 32A. The magnetic flux M of this magnetic field is generated in a direction in which the housing extension portion 22 of the metal housing 2 is formed, in other words, in a direction intersecting the direction D of the central axis O of the external connection terminal 4. In the present embodiment, the magnetic flux M generated by the operation of the switching element 32A is oriented orthogonal to the direction in which the housing extension portion 22 is formed.

(External Connection Terminal 4)

As shown in FIGS. 1 and 4, the external connection terminal 4 is connected to the output terminal 34 of the circuit substrate 3 via the internal wiring 401 such as a bus bar. A connection portion 42 for connecting an external wiring 402 is formed at a part of the external connection terminal 4 outside the metal housing 2. The connection portion 42 of the external connection terminal 4 is disposed extending in the outward direction D2 from the outer surface of the metal housing.

An insertion portion 41 which is inserted through the through hole 211 and the center hole 221 in the external connection terminal 4 is formed in the shape of a round shaft having a circular cross section. The insertion portion 41 of the external connection terminal 4 is inserted continuously into the through hole 211 and the center hole 221. The external connection terminal 4 and the insulator 5 are inserted through the through hole 211 that is formed in the body portion 21 of the metal housing 2 and through the center hole 221 of the housing extension portion 22.

The tip 411 of the insertion portion 41 of the external connection terminal 4 of the present embodiment is located on the tip side of an extension tip 222 of the housing extension portion 22. In other words, the tip 411 of the insertion portion 41 of the external connection terminal 4, disposed in the metal housing 2, projects from the extension tip 222 of the housing extension portion 22, disposed in the metal housing 2. This configuration facilitates connecting internal wiring 401, such as a bus bar that is taken out from the circuit substrate 3 to the external connection terminal 4.

Figure 6:
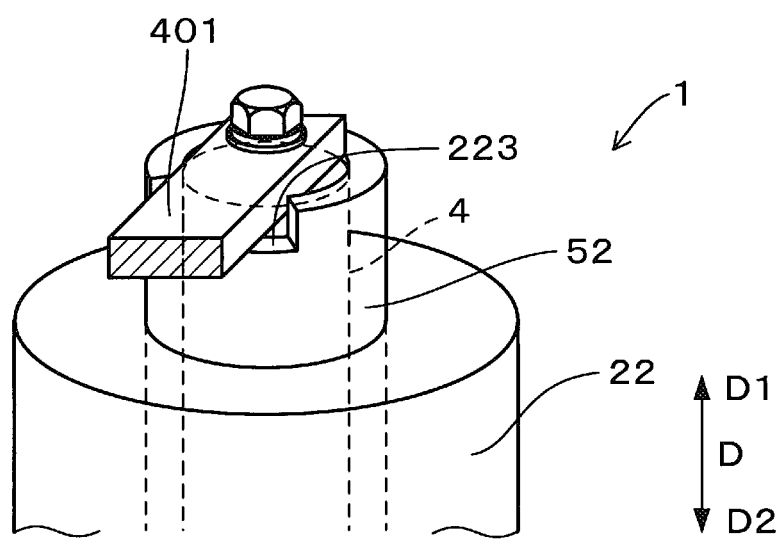
FIG. 6 is a perspective cross-sectional view showing the periphery of the external connection terminal and the housing extension portion of another power conversion device according to the first embodiment.

Furthermore, as shown in FIG. 6, the housing extension portion 22 may be formed with a notch portion 223 in which internal wiring 401, such as a bus bar which is connected to the tip 411 of the insertion portion 41 of the external connection terminal 4, is disposed. Formation of the notch portion 223 enables insulation between the external connection terminal 4 and the housing extension portion 22 to be ensured.

(Insulator 5)

As shown in FIGS. 4 and 5, the insulator 5, which is made of an insulating resin material, serves for attaching the external connection terminal 4 to the metal housing 2 in a condition of being insulated from the metal housing 2. The insulator 5 has a mounting base portion 51 on the side D2 of the body portion 21 of the metal housing 2, and a tubular portion 52 formed projecting from the mounting base portion 51. The tubular portion 52 is a portion of the insulator 5 that is disposed continuously in the through hole 211 and the center hole 221. In other words, the tubular portion 52 is a portion that becomes a dielectric when the pseudo capacitor 10 is formed, and that is enclosed between the inner circumference of the through hole 211 in the body portion 21 of the metal housing 2 and the inner circumference of the center hole 221 in the housing extension portion 22. The tubular portion 52 of the present embodiment is formed as a cylindrical portion.

Insertion holes 511 are formed in the mounting base 51 and the tubular portion 52, used for attaching the insulator 5 to the body portion 21 of the metal housing 2. The insulator 5 is fixed to the metal housing 2 by tightening screws 512 that are inserted in the insertion holes 511, in female screw portions 212 formed in the body portion 21 of the metal housing 2.

Furthermore, as shown in FIG. 4 a locking portion 43 may be formed on the outer periphery of the external connection terminal 4, and the mounting base 51 engaged with the locking portion 43 to form a positioning section 513, for positioning the external connection terminal 4 with respect to the insulator 5. The locking portion 43 and the positioning portion 513, for preventing the external connection terminal 4 from being displaced from the insulator 5, may be formed at various positions where the external connection terminal 4 and the insulator 5 come into contact with each other. Furthermore, the external connection terminal 4 may be disposed as an insert component when molding the insulator 5, or may be integrally disposed with the insulator 5 at the time of insertion-molding the insulator 5.

The tubular portion 52 of the insulator 5 is formed with a constant thickness t2. With this configuration, the thickness of the dielectric forming the pseudo capacitor 10 can readily be kept small, and the capacitance of the pseudo capacitor 10 can be effectively increased. The tubular portion 52 of the present embodiment is formed in a cylindrical shape which follows the outer circumference of the external connection terminal 4, and the inner circumference of the through hole 211 of the body portion 21 and inner circumference of the center hole 221 of the housing extension portion 22.

As shown in FIG. 4, the thickness t2 of the portion of the insulator 5 located between the external connection terminal 4 and the housing extension portion 22, in other words, the thickness t2 of the tubular portion 52, is less than the thickness t1 of the housing extension portion 22. With this configuration, the thickness t2 of the tubular portion 52 constituting the dielectric of the pseudo capacitor 10 can be reduced and the capacitance C of the pseudo capacitor 10 increased. If the thicknesses t1 and t2 are not uniform, the values of the thicknesses t1 and t2 may be taken as being their average values. The thickness t2 of the tubular portion 52 can be, for example, in the range 0.3 to 2 mm.

(Circuit Substrate 3)

As shown in FIGS. 1 and 2, the circuit substrate 3 is made up of a substrate portion 31 and various electronic components 32 provided on the substrate portion 31. The electronic components 32 includes a power converter 321 that converts DC voltages V1 and V2, an input filter 322 connected to the input terminal 33 of the circuit substrate 3 and to the input side of the power converter 321, and an output filter 323 connected to the output side of the power converter 321 and to the output terminal 34 of the circuit substrate 3. A power conversion circuit is formed on the circuit substrate 3 as an electric circuit by the electronic components 32. The switching element 32A, which is one of the electronic components 32 of the circuit substrate 3, consists of an IGBT (insulated gate bipolar transistor), a MOS-FET (MOS type field effect transistor), or the like.

(Action and Effects)

In the power conversion device 1 of the present embodiment, the housing extension portion 22 is formed in the metal housing 2, and the tubular portion 52 is disposed between the external connection terminal 4 and the housing extension portion 22 as the part of the insulator 5. A pseudo capacitor 10, which reduces the noise N that propagates from the power conversion device 1 via the external connection terminal 4 to the battery 62, the low power devices 63, etc., is formed by the external connection terminal 4, the housing extension portion 22 and the insulator 5.

The noise reduction structure using the pseudo capacitor 10 is implemented without using a capacitor as an electronic component, and so can eliminate the equivalent series inductance and the equivalent series resistance that are characteristic of a capacitor. Furthermore, the wiring used to connect a capacitor can be eliminated. As a result, the effect of reducing the propagation of noise N can be obtained even for high frequency noise N, whose propagation cannot be reduced by using a capacitor as an electronic component.

The pseudo capacitor 10 utilizes a metal housing 2, an external connection terminal 4, and an insulator 5, differing from a capacitor as a general electronic component, and can effectively reduce noise N in a high frequency band of several tens of MHz or several hundreds of MHz. For example, the pseudo capacitor 10 can reduce noise N in a high frequency band of 10 MHz or more.

Furthermore, the pseudo capacitor 10 can be formed by utilizing the metal housing 2, the external connection terminal 4 and the insulator 5 which are necessary for configuring the power conversion device 1, without requiring another component to be added. Hence, the pseudo capacitor 10 can be formed by making a simple change to the configuration of the components constituting the power conversion device 1.

Thus, with the power conversion device 1, the effect of reducing the propagation of noise N can be enhanced by making a simple change to the configuration of the components of the power conversion device 1.

Second Embodiment

Figure 7:
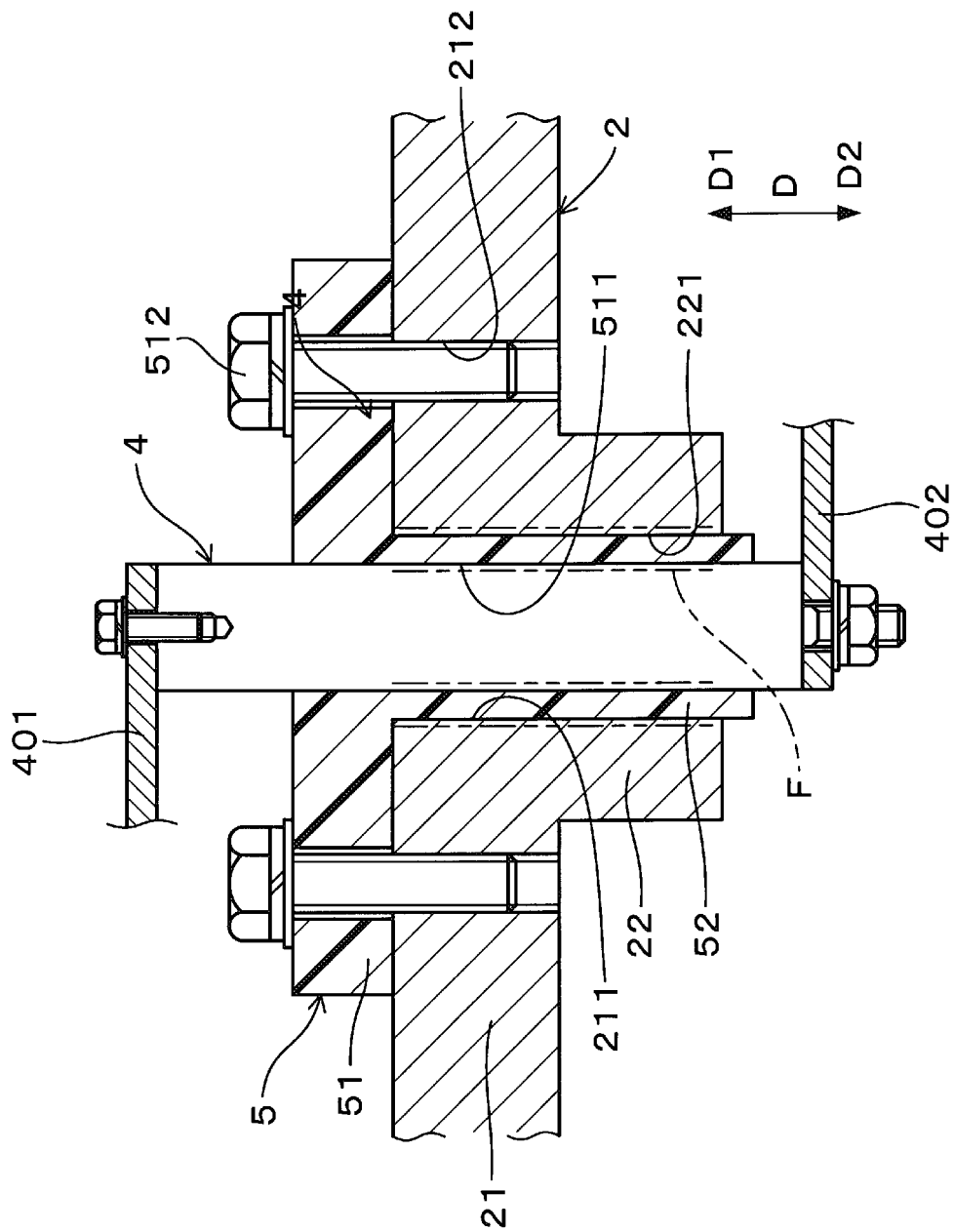
FIG. 7 is a cross-sectional view showing the periphery of an external connection terminal and a housing extension portion of a power conversion device according to a second embodiment.

The present embodiment demonstrates a power conversion device 1 in which the method of forming the housing extension portion 22 of the metal housing 2, the external connection terminal 4, etc., is different from that of the first embodiment. As shown in FIG. 7, the housing extension portion 22 may be formed such as to extend in the outward direction D2 from the body portion 21 of the metal housing 2. In that case also, the housing extension portion 22 can be formed on the peripheral edge of the through hole 211 in the body portion 21 of the metal housing 2. In this case the outer dimensions of the metal housing 2 will be increased, however the space inside the metal housing 2 can be increased.

Figure 8:
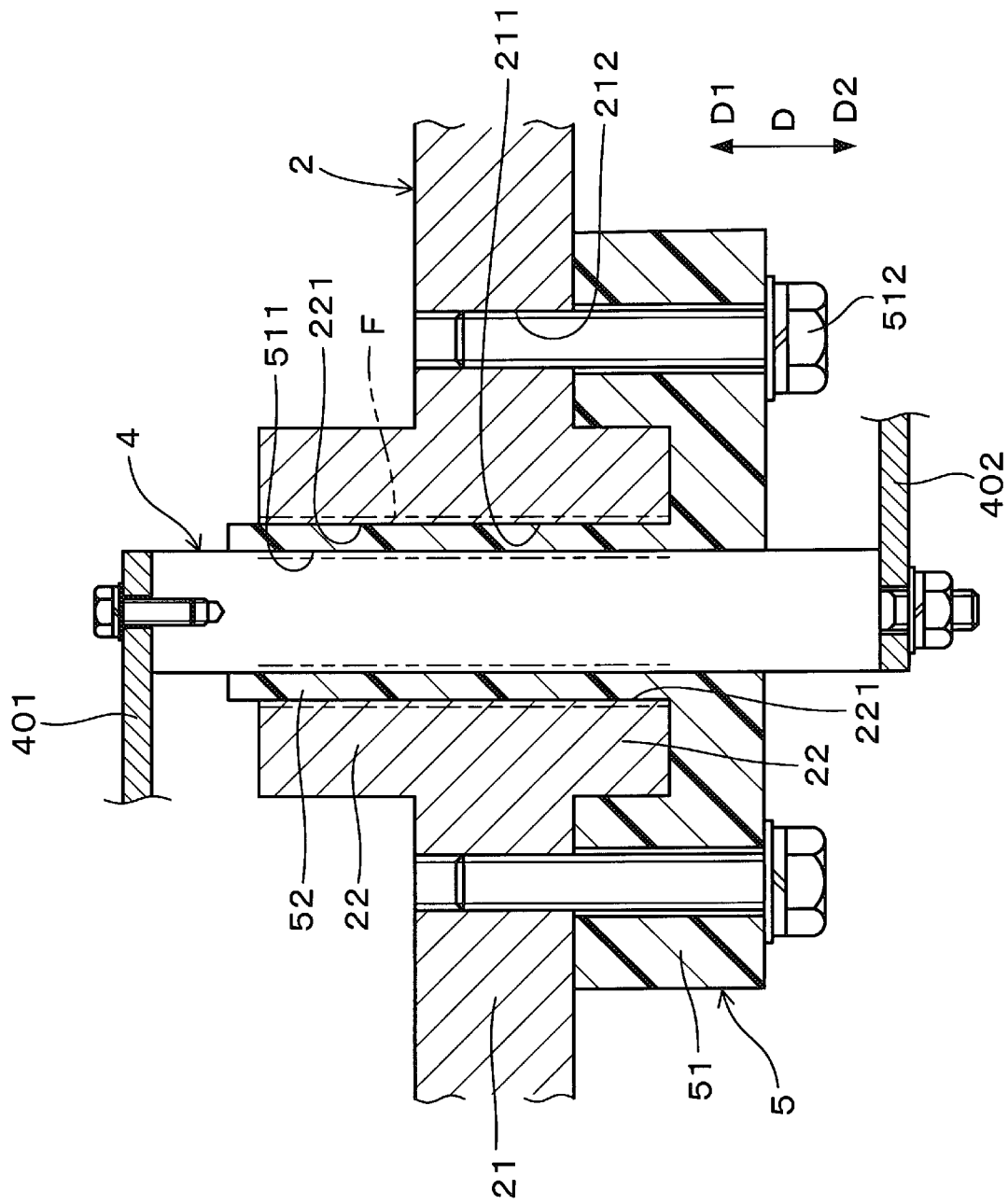
FIG. 8 is a cross-sectional view showing the periphery of the external connection terminal and the housing extension portion of another power conversion device according to the second embodiment.

Furthermore, as shown in FIG. 8, the housing extension portion 22 may be formed such as to extend in the inward direction D1 and also in the outward direction D2 from the body portion 21 of the metal housing 2. In that case, the extension length of the housing extension portion 22 can be increased, and the capacitance C of the pseudo capacitor 10 can be increased. In that case also, the housing extension portion 22 can be formed on the peripheral edge of the through hole 211 in the body portion 21 of the metal housing 2.

Figure 9:
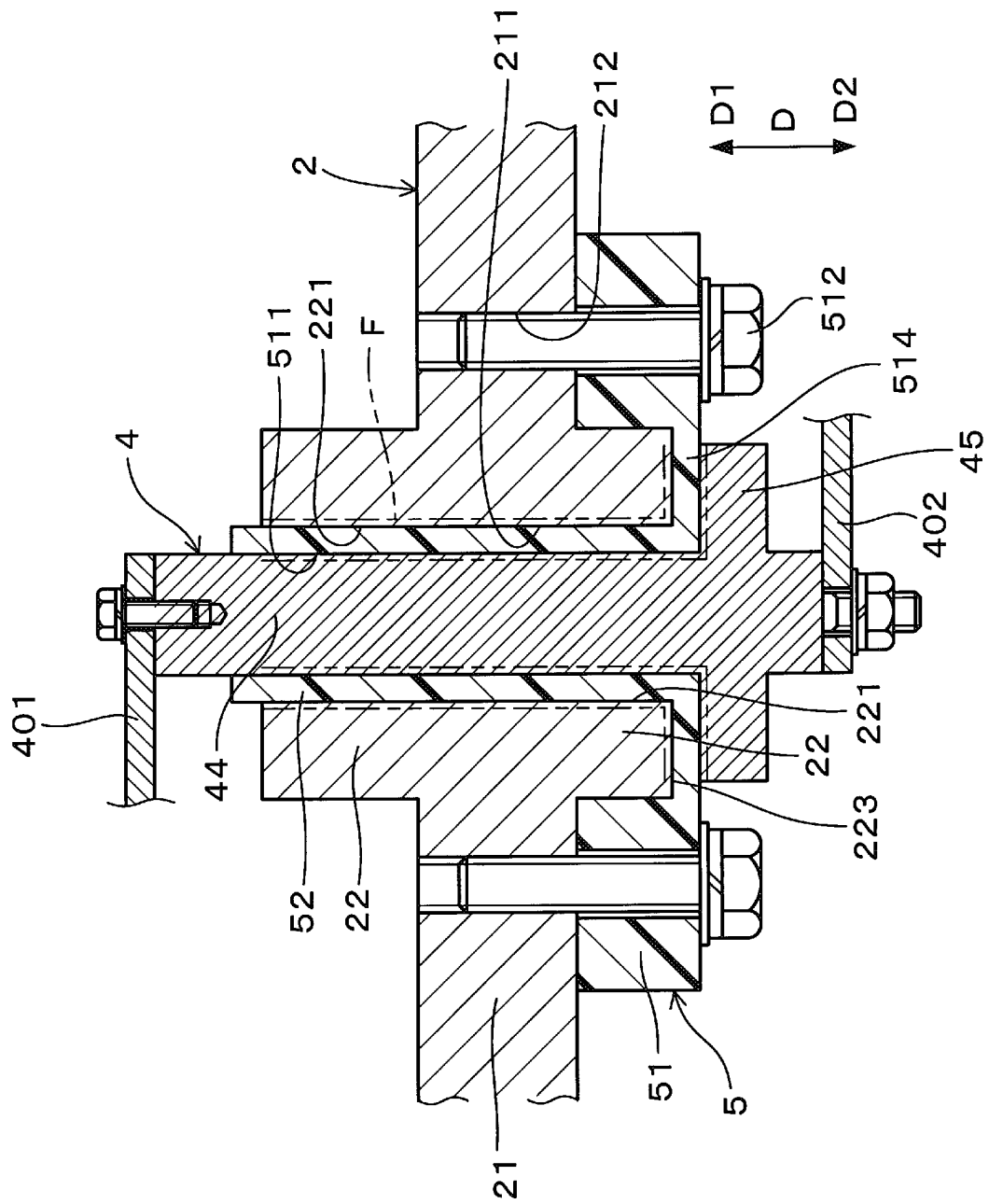
FIG. 9 is a cross-sectional view showing the periphery of the external connection terminal and the housing extension portion of another power conversion device according to the second embodiment.

Furthermore, as shown in FIG. 9, the external connection terminal 4 may have a shaft portion 44 that is parallel to the central axis O and have an expanded-diameter portion 45 with a larger diameter than that of the shaft portion 44. The shaft portion 44 is inserted into the through hole 211 in the body portion 21 of the metal housing 2 and the center hole 221 of the housing extension portion 22, while the enlarged diameter portion 45 is disposed outside the through hole 211 and the center hole 221. In that case, a portion 514 of the mounting base 51 of the insulator 5 is sandwiched between the enlarged diameter portion 45 and the extension tip 222 of the housing extension portion 22. The portion 514 between the enlarged diameter portion 45 and the mounting base portion 51 thereby serves as a dielectric for forming the pseudo capacitor 10. This configuration enables the capacitance C of the pseudo capacitor 10 to be increased.

Figure 10:
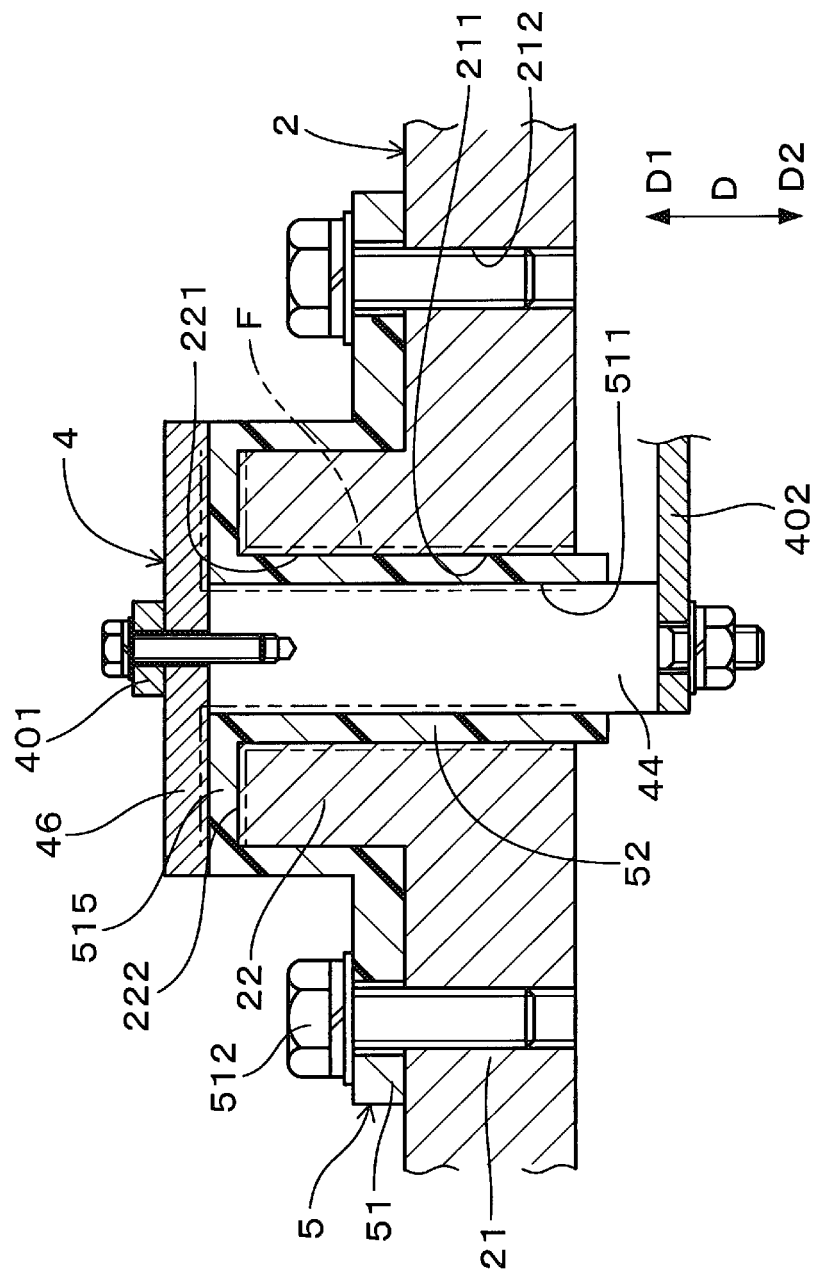
FIG. 10 is a cross-sectional view showing the periphery of the external connection terminal and the housing extension portion of another power conversion device according to the second embodiment.

Furthermore, as shown in FIG. 10, the external connection terminal 4 may be formed by a shaft portion 44 and a disk portion 46 having an outer diameter larger than that of the shaft portion 44. In that case, a portion 515 of the insulator 5 is sandwiched between the disk portion 46 and the extension tip 222 of the housing extension portion 22. The disk portion 46 and the portion 515 of the insulator 5 can thereby be used as a dielectric for forming the pseudo capacitor 10. This too enables the capacitance C of the pseudo capacitor 10 to be increased.

Figure 11:
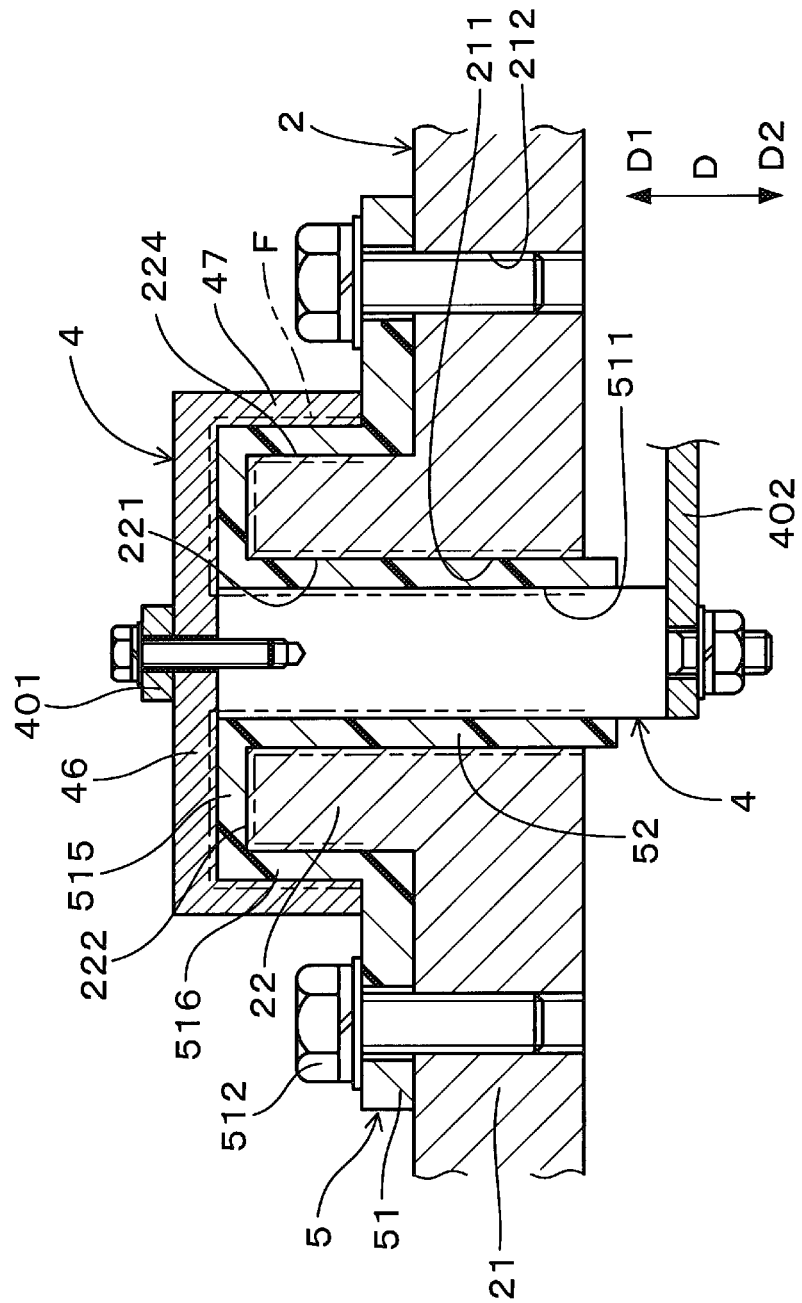
FIG. 11 is a cross-sectional view showing the periphery of the external connection terminal and the housing extension portion of another power conversion device according to the second embodiment.

Furthermore, as shown in FIG. 11, when the external connection terminal 4 is formed by using a shaft portion 44 and a disc portion 46, the tip of the disc portion 46 may be bent to form a bent portion 47, which extends parallel to the direction D of the central axis O. In that case, a portion 515 of the insulator 5 is sandwiched between the disk portion 46 and the extension tip 222 of the housing extension portion 22, while another portion 516 of the insulator 5 is sandwiched between the bent portion 47 and the outer peripheral surface 224 of the housing extension portion 22. The disk portion 46, the bent portion 47, and the portion 515 and the other portion 516 of the insulator 5 can thereby be used as a dielectric for forming the pseudo capacitor 10. This configuration enables the capacitance C of the pseudo capacitor 10 to be further increased.

Furthermore, although not shown, when the external connection terminal 4 has the shaft portion 44 and the diameter-expanded portion 45, the housing extension portion 22 may be formed at a position facing the outer periphery of the diameter-expanded portion 45. Furthermore, the shapes of the external connection terminal 4 and the housing extension portion 22 may be appropriately modified in order to increase the capacitance C of the pseudo capacitor 10.

Other configurations, operational effects, etc., of the power conversion device 1 of the present embodiment are the same as those of the first embodiment. Furthermore, in the present embodiment also, components indicated by the same reference numerals as those shown for the first embodiment are the same as those in the first embodiment.

Third Embodiment

The present embodiment demonstrates a power conversion device 1 which incorporates various concepts that differ from those of the first and second embodiments. As shown in FIG. 12, the pseudo capacitor 10 may be formed by a plurality of external connection terminals 4, a housing extension portion 22 that faces and surrounds the plurality of external connection terminals 4, and a portion of the insulator 5 that is disposed between the plurality of external connection terminals 4 and the housing extension portion 22. The plurality of external connection terminals 4 may connect output terminals 34 having respectively different voltages to the battery 62, the low power device 63, etc., as external devices.

Furthermore, although not shown, two or more pseudo capacitors 10 may be formed using external connection terminals 4 at different locations in the metal housing 2.

Furthermore, as shown in FIG. 13, the external connection terminal 4 may be formed with a rectangular cross section. Also, the housing extension portion 22 may be formed only on a part of the circumference of the external connection terminal 4 in the circumferential direction, and not on the entire circumference. In other words, the housing extension portion 22 may be formed in a wall shape other than a tubular shape. However, it is preferable for the housing extension portion 22 to be formed in a range of half a circumference or more around the central axis O of the external connection terminal 4.

Furthermore, although not shown, the housing extension portion 22 may be formed by utilizing the side wall portion 24 of the body portion 21 of the metal housing 2. In other words, the housing extension portion 22 may be formed in a tubular shape by utilizing a side wall portion 24. In that case, the space occupied by the housing extension portion 22 in the metal housing 2 can be reduced.

Other configurations, operational effects, etc., of the power conversion device 1 of the present embodiment are the same as those of the first embodiment. Furthermore, in the present embodiment also, components indicated by the same reference numerals as those shown for the first embodiment are the same as those in the first embodiment.

The electronic device 1 may be a device other than a power conversion device, for which it is necessary to reduce the propagation of noise. Furthermore, the power conversion device 1 may be a device other than a DC-DC converter.

The present disclosure is not limited to the above embodiments, and further different embodiments may be configured without departing from the gist thereof. In addition, the scope of the present disclosure includes various modifications, modifications within a range of equivalents, etc. Furthermore, various combinations of configuration elements, and forms, etc., may be envisaged from the present disclosure, that are within the technical concepts of the present disclosure.

What is claimed is:

1. An electronic device provided with
    a circuit substrate on which an electric circuit is formed,
    a metal housing that houses the circuit substrate, is grounded to a first ground, and is connected to a second ground of the circuit substrate,
    an external connection terminal that projects from the interior to the exterior of the metal housing, and connects an input terminal or an output terminal of the circuit substrate to the exterior, and
    an insulator which has at least a part thereof disposed between the metal housing and the external connection terminal and which insulates the metal housing and the external connection terminal from one another;
    wherein:
    a housing extension portion is formed in the metal housing, extending, from a body portion of the metal housing, in the inward direction or in the outward direction with respect to the metal housing, in a condition facing the external connection terminal; and
    at least a part of the insulator is disposed between the external connection terminal and the housing extension portion.

2. The electronic device according to claim 1, wherein:
    the external connection terminal and the insulator are inserted into a through hole formed in the body portion of the metal housing; and
    the housing extension portion is formed facing the external connection terminal, on a peripheral edge of the through hole, within a range of half a circumference or more around the external connection terminal.

3. The electronic device according to claim 1, wherein:
    the external connection terminal serves to connect the output terminal of the circuit substrate to the exterior; and
    a pseudo capacitor is formed by the external connection terminal, the housing extension portion and the insulator, that reduces propagation of noise to the exterior of the metal housing via the external connection terminal, the noise being generated by operation of a switching element provided on the circuit substrate.

4. The electronic device according to claim 1, wherein the housing extension portion extends from the body portion of the metal housing towards the interior of the metal housing in a condition to be intersected by a magnetic flux that is generated by operation of the switching element provided on the circuit substrate.

5. The electronic device according to claim 1, wherein a second thickness of a portion of the insulator disposed between the external connection terminal and the housing extension portion is less than a first thickness of the housing extension portion.

6. The electronic device according to claim 1, wherein:
    the housing extension portion is formed in a tubular shape, having a center hole that communicates with a through hole formed in the body portion of the metal housing;
    the external connection terminal is continuously inserted into the through hole and the center hole; and
    the insulator has a constant thickness and is disposed continuously in the through hole and the center hole.

7. The electronic device according to claim 1, wherein parts of the external connection terminal that face the housing extension portion via at least a part of the insulator include a shaft portion that is oriented parallel to the central axis of the external connection terminal, and an enlarged diameter portion or a disk portion.

8. The electronic device according to claim 1, wherein the electronic device constitutes a power conversion device in which the electric circuit of the circuit substrate performs conversion of the magnitude of DC power.

* * * * *